(12) United States Patent
Sullivan et al.

(10) Patent No.: US 8,723,052 B1
(45) Date of Patent: May 13, 2014

(54) METHODS AND APPARATUS FOR OPTIMIZING ELECTRICAL INTERCONNECTS ON LAMINATED COMPOSITE ASSEMBLIES

(71) Applicant: Boulder Wind Power, Inc., Louisville, CO (US)

(72) Inventors: Brian Sullivan, Boulder, CO (US); Stephane Eisen, Louisville, CO (US)

(73) Assignee: Boulder Wind Power, Inc., Louisville, CO (US)

( * ) Notice: Subject to any disclaimer, the term of this patent is extended or adjusted under 35 U.S.C. 154(b) by 0 days.

(21) Appl. No.: 13/778,415

(22) Filed: Feb. 27, 2013

(51) Int. Cl.
*H05K 1/11* (2006.01)

(52) U.S. Cl.
USPC .......................... 174/266; 174/261; 174/262

(58) Field of Classification Search
None
See application file for complete search history.

(56) References Cited

U.S. PATENT DOCUMENTS

| | | | |
|---|---|---|---|
| 5,172,472 | A | 12/1992 | Lindner et al. |
| 5,365,424 | A | 11/1994 | Deam et al. |
| 5,428,327 | A * | 6/1995 | Bahl ............................ 333/246 |
| 5,579,217 | A | 11/1996 | Deam et al. |
| 5,619,085 | A | 4/1997 | Shramo |
| 5,928,757 | A | 7/1999 | Shinada et al. |
| 6,141,885 | A | 11/2000 | Ishitani et al. |
| 6,229,124 | B1 | 5/2001 | Trucco |
| 6,310,387 | B1 | 10/2001 | Seefeldt et al. |
| 6,538,538 | B2 | 3/2003 | Hreish et al. |
| 6,574,108 | B1 | 6/2003 | Kramer et al. |
| 6,593,838 | B2 | 7/2003 | Yue |
| 6,713,685 | B1 | 3/2004 | Cotton |
| 6,820,321 | B2 | 11/2004 | Harding |
| 6,833,603 | B1 | 12/2004 | Park et al. |
| 6,836,036 | B2 | 12/2004 | Dube |
| 6,848,912 | B2 | 2/2005 | Zhang |
| 6,923,552 | B2 | 8/2005 | Tseng |
| 7,061,133 | B1 | 6/2006 | Leijon et al. |
| 7,109,625 | B1 | 9/2006 | Jore et al. |

(Continued)

FOREIGN PATENT DOCUMENTS

| | | |
|---|---|---|
| EP | 1732011 | 12/2006 |
| TW | 200830967 A | 7/2008 |

OTHER PUBLICATIONS

"High Speed Layout Design Guidelines," Freescale Semiconductor Application Note, Document No. AN2536, Rev. 2, Apr. 2006, 26 pgs.

(Continued)

*Primary Examiner* — Tuan T Dinh
*Assistant Examiner* — Steven T Sawyer
(74) *Attorney, Agent, or Firm* — Cooley LLP

(57) ABSTRACT

In some embodiments, a system includes a conductor on a first layer of a laminated composite assembly. The laminated composite assembly has an input, an output, a first electrical interconnect which couples the conductor on the first layer of the laminated composite assembly with a second conductor on a second layer of the laminated composite assembly, and a second electrical interconnect which electrically couples the first conductor with the second conductor. A width of the second electrical interconnect is greater than a width of the first electrical interconnect. A resistance of the laminated composite assembly as measured between the electrical input and the electrical output is less than the resistance of the laminated composite assembly as measured between the electrical input and the electrical output if the width of the first electrical interconnect were substantially equal to the width of the second electrical interconnect.

24 Claims, 13 Drawing Sheets

(56) References Cited

U.S. PATENT DOCUMENTS

| | | | |
|---|---|---|---|
| 7,135,952 | B2 | 11/2006 | Harding |
| 7,463,122 | B2 | 12/2008 | Kushta et al. |
| 7,557,423 | B2 | 7/2009 | Ching et al. |
| 7,602,272 | B2 | 10/2009 | Whittaker et al. |
| 7,615,709 | B2 | 11/2009 | Goergen |
| 7,648,900 | B2 | 1/2010 | Kirby |
| 7,710,234 | B2 | 5/2010 | Gardner et al. |
| 7,863,724 | B2 | 1/2011 | Douriet et al. |
| 7,977,237 | B2 | 7/2011 | Feustel et al. |
| 7,979,983 | B2 | 7/2011 | Bird et al. |
| 8,022,532 | B2 | 9/2011 | Kasuya et al. |
| 8,031,033 | B2 | 10/2011 | Mansell et al. |
| 8,089,331 | B2 | 1/2012 | Jacobson et al. |
| 8,110,749 | B2 | 2/2012 | Yoshimura et al. |
| 8,129,625 | B2 | 3/2012 | Kato |
| 8,167,629 | B2 | 5/2012 | Ito et al. |
| 2001/0032388 | A1 | 10/2001 | Morris |
| 2004/0150490 | A1* | 8/2004 | Smith et al. ............ 333/33 |
| 2006/0099801 | A1* | 5/2006 | Cranmer et al. .......... 438/637 |
| 2010/0032195 | A1* | 2/2010 | Hayashi ............ 174/260 |
| 2010/0085717 | A1 | 4/2010 | Sweeney et al. |
| 2010/0308939 | A1 | 12/2010 | Kurs |
| 2011/0273048 | A1 | 11/2011 | Jore et al. |
| 2012/0080797 | A1 | 4/2012 | Daubenspeck et al. |
| 2012/0097436 | A1 | 4/2012 | Lai et al. |
| 2012/0206132 | A1 | 8/2012 | Lepage |

OTHER PUBLICATIONS

Qpedia-2010, "Understanding and Optimizing Thermal Vias," Guenin B, 2010, <URL:http://qats.com/cpanel/UploadedPdf/Qpedia_Thermal_eMagazine_0510_V3_Iorez.pdf>.

Kubik et al., "Kubik-2006" PCB racetrack fluxgate sensor with improved temptsature stability, Czech Technical University in Prague, Faculty of Electrical Engineering, Technicka 2, CZ-16627 Praha 6, Czech Republic, 2006. http://www.sciencedirect.com/science/article/pii/S0924424705007624.pdf.

Gambetta et al., "Designing Printed Circuit Stators for Brushless Permanent Magnet Motors," 2009, URL:http:eprints.usq.edu.au/6491/3/Gambetta_Ahfock_IET_2009_AV.pdf.

* cited by examiner

METHODS AND APPARATUS FOR OPTIMIZING ELECTRICAL INTERCONNECTS ON LAMINATED COMPOSITE ASSEMBLIES

BACKGROUND

This invention relates to systems and methods for optimizing electrical interconnects on laminated composite assemblies.

Some known laminated composite assemblies, especially those that include machine windings, can include a circuit board having layers of selectively etched copper separated by a thin dielectric sheet. As an example, windings for an axial flux machine are formed using radial operative conductors on the layers of the laminated composite assembly. Each operative conductor can be electrically coupled to other operative conductors of a common phase through end turns on selected layers of the laminated composite assembly. In such a configuration, when viewed as a two-dimensional overlay in the axial direction, the end turn sections from different phases may overlap. Therefore, in order to provide electrical separation between phases, the end turns for each phase can reside on separate layers, as opposed to the operative conductors, which do not have such overlap as viewed through the thickness of the board. The end turns for each phase can, therefore, coexist on a layer with the operative conductors of different phases.

The operative conductors of a phase that are on layers not having an end turn section for that phase can be electrically coupled to an end turn section for that phase with an electrical interconnect, which electrically couples conductors on different layers of the laminated composite assembly. The current density and/or thermal profile of the electrical interconnect can be relatively high when compared with the current density and/or thermal profile of the operative conductors and/or end turns.

Thus, a need exists for improved systems and methods of distributing current density and heat generation in laminated composite assemblies.

SUMMARY

In some embodiments, a system includes a conductor on a first layer of a laminated composite assembly. The laminated composite assembly has an input, an output, a first electrical interconnect, which couples the conductor on the first layer of the laminated composite assembly with a second conductor on a second layer of the laminated composite assembly, and a second electrical interconnect, which electrically couples the first conductor with the second conductor. A width of the second electrical interconnect is greater than a width of the first electrical interconnect. A resistance of the laminated composite assembly as measured between the electrical input and the electrical output is less than the resistance of the laminated composite assembly as measured between the electrical input and the electrical output if the width of the first electrical interconnect were substantially equal to the width of the second electrical interconnect.

DETAILED DESCRIPTION

In some embodiments, a system includes at least two conductors on separate layers of a laminated composite assembly. The two conductors can be electrically coupled with at least two electrical interconnects. The width of the second electrical interconnect can be greater than the width of the first electrical interconnect. Varying the width of the electrical interconnects can cause the resistance of the laminated composite assembly as measured between its electrical input and its electrical output to be less than if the width of the first electrical interconnect were substantially equal to the width of the second electrical interconnect.

In other embodiments, a system includes at least two conductors on separate layers of a laminated composite assembly. The two conductors can be electrically coupled with at least two plated electrical interconnects, each of which defines a lumen. The lumen defined by the second electrical interconnect can have a width greater than the width of the lumen defined by the first electrical interconnect. Varying the width of the lumens defined by the electrical interconnects allows the designer to achieve a desired current density of the laminated composite assembly, thermal profile of the laminated composite assembly, or mechanical coupling profile of the laminated composite assembly.

In other embodiments, a system includes at least two conductors on separate layers of a laminated composite assembly. The two conductors can be electrically coupled with multiple electrical interconnects. Each electrical interconnect can have a width different from a width of at least one other electrical interconnect. Varying the width of the electrical interconnect allows the designer to achieve a desired current density of the laminated composite assembly, thermal profile of the laminated composite assembly, or mechanical coupling profile of the laminated composite assembly when a current flow is induced in the first conductor.

Figure 1:
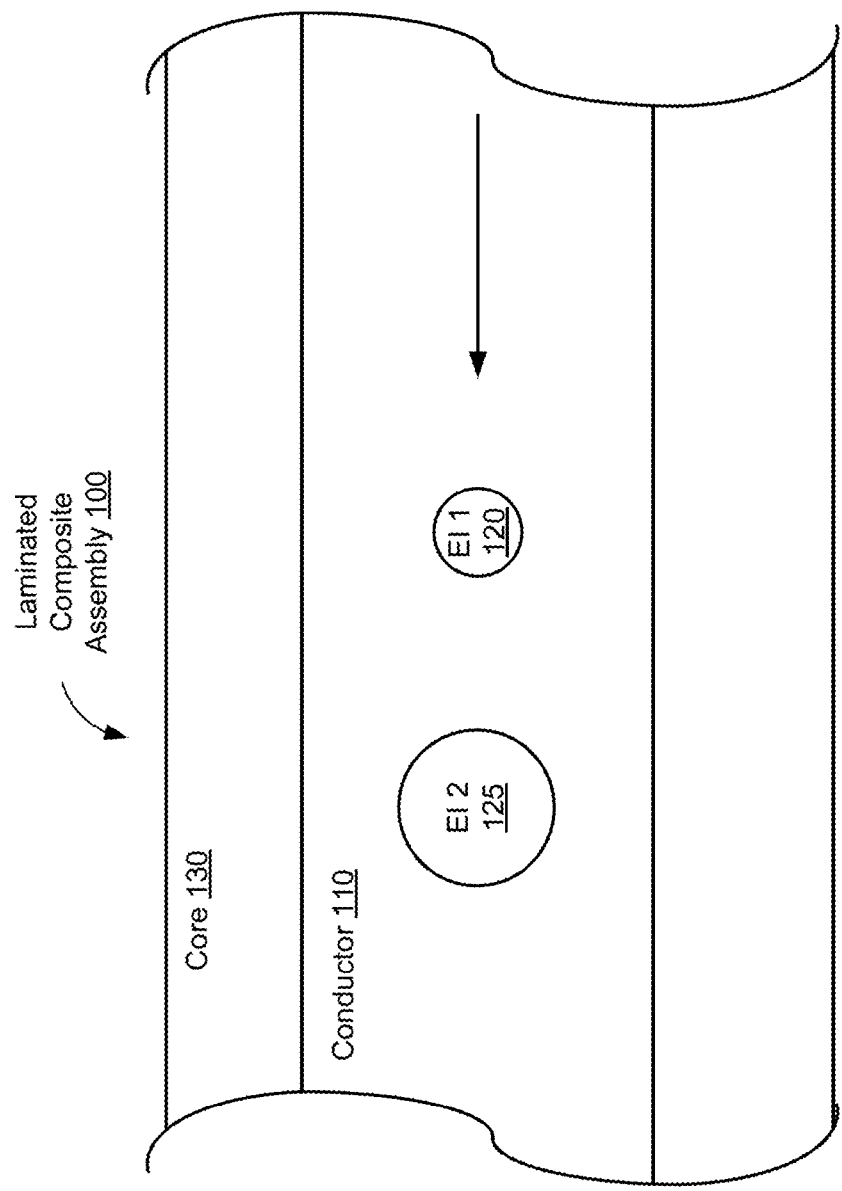
FIG. 1 illustrates a laminated composite assembly with multiple electrical interconnects, according to an embodiment.

FIG. 1 is a schematic illustration of a top view of a portion of a single layer of laminated composite assembly 100 having a first conductor 110 and multiple electrical interconnects 120, 125. Current "I" is configured to flow on conductor 110. The portion of laminated composite assembly 100 can be used to support a portion of an electronic circuit. For example, the portion of laminated composite assembly 100 can be a portion of an integrated circuit ("IC"), a printed circuit board ("PCB"), a PCB assembly, an application-specific integrated circuit ("ASIC"), or any other electronic circuit support structure that implements multiple electrical interconnects.

Figure 2A:
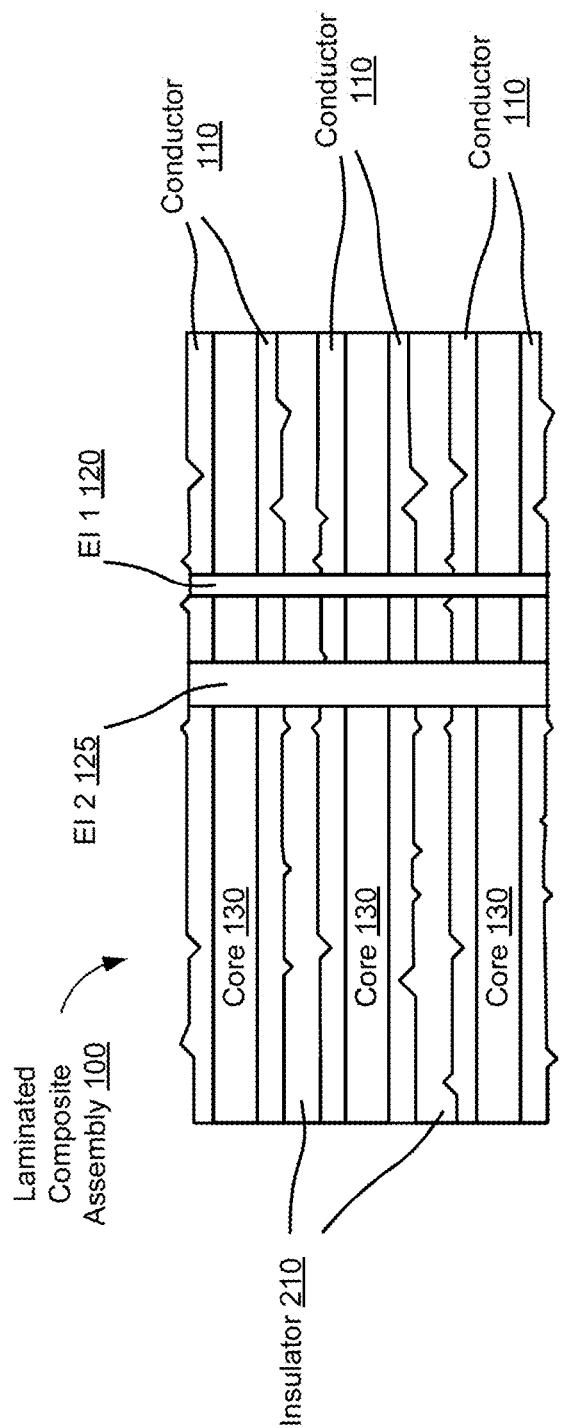
FIGS. 2A-2C illustrate example cross-sectional views of the laminated composite assembly of FIG. 1, according to embodiments.
Figure 2B:
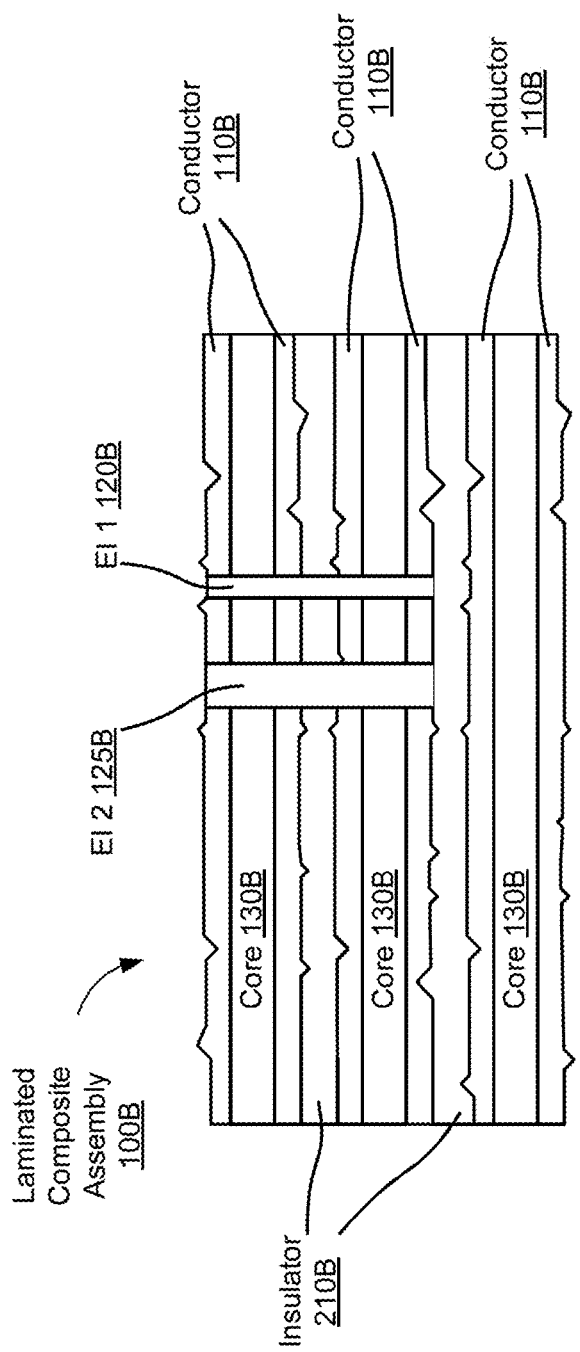
Figure 2C:
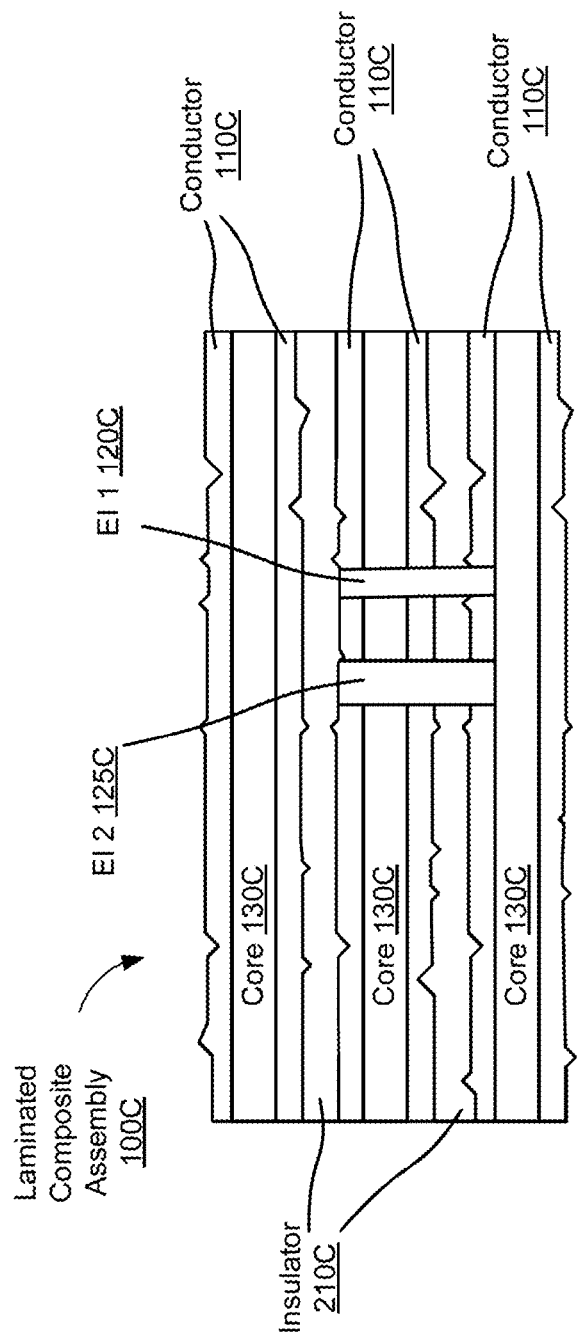

While a single layer is shown in FIG. 1, laminated composite assembly 100 can have multiple layers, as shown in FIGS. 2A-2C, for example. In some embodiments with multiple layers, the layers are separated by insulator 210. A layer can include conductor 110, core 130, and one or more electrical interconnects 120, 125.

Core 130 can be made from any number of materials including fiberglass resin material, silicon, or any other suitable substrate. In some embodiments, the core 130 of a layer can provide a base for conductor 110. For example, a PCB provides a base (e.g., core 130 of a PCB) for the thin conductors 110 etched on the PCB.

The layers of laminated composite assembly 100 can include internal bus bar conductors, power distribution conductors, end turns of a stator coil, windings of a stator coil, signal conductors, power conductors, and/or any other appropriate conductor. Additionally, a single layer can include multiple types of conductors. For example, a single layer can include an internal bus bar conductor and a power distribution conductor.

Insulators 210 can separate the layers of laminated composite assembly 100. Insulators 210 of laminated composite assembly 100 can be made from a dielectric material or any other suitable material that has poor or substantially no conductivity. Since they are poor conductors, insulators 210 can act as a shield between the conductive layers (e.g., conductors 110) of laminated composite assembly 100. Similarly stated, insulator 210 can substantially prevent current from flowing between the layers between which insulator 210 is located.

In some embodiments, conductor 110 can be copper, silver, aluminum, gold, zinc, tin, tungsten, graphite, conductive polymer, and/or any other suitable conductive material. Conductor 110 can be placed and/or etched on core 130, including being on one or more layers of laminated composite assembly 100. In some embodiments, conductor 110 can cover a portion of core 130 (as shown in FIG. 1), the entirety of core 130, a portion of core 130 of one or more layers of laminated composite assembly 100, the entirety of core 130 of one or more layers of laminated composite assembly 100, or any combination thereof.

Conductor 110 can form part of the circuit of laminated composite assembly 100. In a circuit, conductor 110 can be used to couple components and allow the flow of current through the circuit. When, however, multiple layers are used in laminated composite assembly 100, conductors 110 on each layer are generally not electrically coupled to each other unless some form of electrical interconnect 120, 125 is used because core 130 and insulator 210 are generally non-conductive materials.

As mentioned above, multiple electrical interconnects 120, 125 electrically couple the layers of laminated composite assembly 100. Electrical interconnects 120, 125 can each be a solid electrical interconnect, a pressed pin, a plated electrical interconnect that defines a lumen, and/or any other connection capable of electrically coupling layers of laminated composite assembly 100. In the case that electrical interconnect 120, 125 defines a lumen, the lumen can remain empty (e.g., a cavity having air), be filled with a non-conductive material, or be filled with a conductive material. In some embodiments, multiple electrical interconnects 120, 125 can be the same (e.g., each are a pressed pin) or different (e.g., the first electrical interconnect 120 is a plated electrical interconnect that defines a lumen filled with non-conductive material and the second electrical interconnect 125 is a pressed pin).

In some embodiments, electrical interconnects 120, 125 can be circular in shape as shown in FIG. 1. In other embodiments, electrical interconnects 120, 125 can be square, triangle, star, diamond, irregular, and/or any other suitable shape as shown in further detail herein. Additionally, while FIG. 1 shows the first electrical interconnect 120 and the second electrical interconnect 125 as the same shape, in other embodiments, electrical interconnects 120, 125 can be different shapes.

Multiple electrical interconnects 120, 125 can electrically couple any number of layers of laminated composite assembly 100. In some embodiments, the first electrical interconnect 120 can electrically couple the same layers as the second electrical interconnect 125, different layers than the second electrical interconnect 125, or some of the same layers as the second electrical interconnect 125. Furthermore, multiple electrical interconnects 120, 125 can electrically couple conductors on different layers that perform different functions within the laminated composite assembly 100. For example, multiple electrical interconnects can electrically couple a power distribution conductor to an internal bus bar conductor and/or an end turn of a stator coil.

Multiple electrical interconnects 120, 125 can be used to allow the flow of electrical current "I" through the circuit from a first layer of laminated composite assembly 100 to a second layer of laminated composite assembly 100. For example, the multiple electrical interconnects 120, 125 can be conductively-plated vias that are capable of electrically coupling one or more conductors of different layers of laminated composite assembly 100, such as a PCB. Multiple electrical interconnects 120, 125 can electrically couple one or more conductors on an inner layer of laminated composite assembly 100 to a conductor on a surface layer, conductors on two or more inner layers, conductors on two surface layers, or any combination thereof.

For example, FIG. 2A is a cross sectional view of the laminated composite assembly 100 of FIG. 1. As shown in FIG. 2A, multiple electrical interconnects 120, 125 can electrically couple all layers of laminated composite assembly 100. In other embodiments, multiple electrical interconnects 120, 125 can couple fewer layers.

FIGS. 2B and 2C are structurally and functionally similar to FIG. 2A, thus they will not be described in detail herein. As seen in FIG. 2B, however, electrical interconnects 120B, 125B can electrically couple fewer layers of the laminated composite assembly 100B in some embodiments. For example, electrical interconnects 125B and 120B electrically couple only four of the layers of laminated composite assembly 100B, including a surface layer, in FIG. 2B. Several layers in FIG. 2B are not electrically coupled to other layers using multiple electrical interconnects 120B, 125B. In some embodiments, other electrical interconnects can be used to electrically couple conductors on the remaining layers of the laminated composite assembly 100B. In yet other embodiments, the conductors on some of the layers of the laminated composite assembly 100B can be electrically isolated from conductors on other layers of the laminated composite assembly 100B.

Additionally, as shown in FIG. 2C, multiple electrical interconnects 120C, 125C can electrically couple several layers of laminated composite assembly 100C, not including a surface layer, in some embodiments. As shown in FIG. 2C, the electrical interconnects 120C, 125C do not electrically couple several layers to other layers. Additionally, electrical interconnects 120C, 125C do not electrically couple surface layers with another layer.

FIGS. 2A-2C show example embodiments, but any combination of layers can be coupled using electrical interconnects. Also, as described in more detail herein, the number, shape and size of the electrical interconnects can vary in some embodiments.

As shown in FIG. 1, the first electrical interconnect 120 can have a smaller width than the second electrical interconnect 125. In other embodiments, the first electrical interconnect 120 can have a larger width than the second electrical interconnect 125.

Multiple electrical interconnects 120, 125 can be located on conductor 110 at any location including near a centerline of conductor 110, as shown in FIG. 1, near an edge of conductor 110, or any other suitable location as shown in further detail herein. FIG. 1 shows the first electrical interconnect 120 in close proximity to the second electrical interconnect 125. In other embodiments, the first electrical interconnect 120 can be any distance from the second electrical interconnect 125. FIG. 1 also shows a current "I", which flows in the direction shown. The first electrical interconnect 120 is disposed in the path of the current "I" prior to the second electrical interconnect 125 on conductor 110 with only conductor between the first electrical interconnect 120 and the second electrical interconnect 125. This defines an electrical parallel configuration when both electrical interconnect 120 and electrical interconnect 125 electrically couple conductor 110 to a common conductor on another layer. In other embodiments, electrical components (e.g., resistors, inductors, etc.) can exist in the path of the current "I" between the first electrical interconnect 120 and the second electrical interconnect 125. In some embodiments, there can be any number of electrical interconnects on the same conductor, as shown in further detail herein.

Multiple electrical interconnects 120, 125 can conduct not only current "I", but also thermal energy. The thermal energy transfer allows heat to flow between conductors 110 on the layers of laminated composite assembly 100 that are electrically coupled through multiple electrical interconnects 120, 125. For example, heat can flow from an inner layer to a surface layer of laminated composite assembly 100, depending on the configuration of multiple electrical interconnects 120, 125. By varying the width of the electrical interconnects 120, 125, a designer can achieve a desired thermal profile of laminated composite assembly 100.

Each electrical interconnect 120, 125 can have a resistance value associated therewith. The resistance value can depend on the structure of electrical interconnect 120, 125. For example, the shape and material used for electrical interconnect 120, 125 can affect the resistance value. The width of electrical interconnect 120, 125 can also affect the resistance value. For example, varying a width of electrical interconnect 120, 125 can vary the resistance associated with that electrical interconnect 120, 125. When a current is induced and/or applied to conductor 110 having one or more electrical interconnects 120, 125, the resistance associated with electrical interconnect 120, 125 can determine the amount of current that flows through electrical interconnect 120, 125. Similarly stated, as the resistance of electrical interconnect 120, 125 is increased, less current will flow through electrical interconnect 120, 125. Conversely, as the resistance of electrical interconnect 120, 125 is decreased, more current will flow through electrical interconnect 120, 125. A designer can choose predetermined resistances for electrical interconnects 120, 125 to achieve a predetermined current density of the laminated composite assembly 100.

In some embodiments, laminated composite assembly 100 can have an electrical input and an electrical output. A resistance can be measured between the electrical input and the electrical output of laminated composite assembly 100. When a width of the second electrical interconnect 125 is greater than a width of the first electrical interconnect 120, as shown in FIG. 1, the resistance of laminated composite assembly 100 can be less than the resistance of a laminated composite assembly having a first electrical interconnect with a width substantially equal to a width of a second electrical interconnect. The widths of the electrical interconnects 120, 125 can be used to define a predetermined resistance between the electrical input and the electrical output of the laminated composite assembly.

In some embodiments, the multiple electrical interconnects can be manufactured using any suitable method, including, for example, water jet cutting, drilling, machining, or laser drilling.

In use, a current "I" flows in the direction shown in FIG. 1. As shown in FIG. 1, the first electrical interconnect 120 is disposed in the current "I" path prior to the second electrical interconnect 125. Similarly stated, the current "I" flowing through conductor 110 can reach the first electrical interconnect 120 before reaching the second electrical interconnect 125. Having electrical interconnects 120, 125 with different widths can result in more uniform current density in laminated composite assembly 100. For example, if the current "I" is flowing in the direction shown in FIG. 1 and the width of the second electrical interconnect 125 is larger than the width of the first electrical interconnect 120, the current density can be more uniform because the resistance of the second electrical interconnect 125 will be reduced as compared to the resistance of the second electrical interconnect 125 if it were the same width as the first electrical interconnect 120. Similarly stated, the smaller width of the first electrical interconnect 120 can allow less current "I" through and more current "I" can flow to the wider, second electrical interconnect 125. The result can be a more uniform current density in laminated composite assembly 100.

In some embodiments, the ratio of widths of the electrical interconnects 120, 125 can be configured to result in a predetermined current density flowing through the electrical interconnects, a predetermined thermal profile of laminated composite assembly 100, or a predetermined mechanical coupling profile of laminated composite assembly 100.

In some embodiments, the mechanical coupling profile of laminated composite assembly 100 can be changed by varying the width and number of electrical interconnects 120, 125 in laminated composite assembly 100. As shown in FIGS. 2A-2C, electrical interconnects 120, 125 mechanically bind the conductive layers (i.e., core 130 and conductor 110) and insulating layers (i.e., insulators 210) of laminated composite assembly 100. Increasing the binding of the layers can increase the mechanical strength of laminated composite assembly 100. In some embodiments, the binding can be increased by increasing the number of electrical interconnects 120, 125. In some embodiments, increasing the width of the electrical interconnects 120, 125 can increase the binding of the layers of the laminated composite assembly.

The addition of an electrical interconnect 120, 125 can involve removal of material of the laminated composite assembly 100 (e.g., copper from the conductors and dielectric from the layers). As shown in FIGS. 2A-2C, a cross-section of laminated composite assembly 100 with an electrical interconnect 120, 125 can have a conductive area that is less than the conductive area of a cross-section of laminated composite assembly 100 if it did not include an electrical interconnect 120, 125. Because the electrical interconnects remove material from the laminated composite assembly, the mechanical coupling profile can be negatively impacted if the width and/or number of electrical interconnects is too large. Similarly stated, if there is too little material remaining in the laminated composite assembly after the electrical interconnects are defined, the mechanical strength of the laminated composite assembly can be less than if fewer or narrower electrical interconnects were used in the laminated composite assembly. A predetermined mechanical coupling profile can be achieved using widths and number of electrical interconnects in the design of a laminated composite assembly.

While shown and described with respect to FIG. 1 as being direct current ("DC"), in other embodiments, alternating current ("AC") can be used, as described in further detail herein. For example, in AC embodiments, initially current will flow in the direction shown in FIG. 1. Then the current will alternate to flow in the opposite direction. The current will continue to alternate direction back and forth at a frequency.

Figure 3:
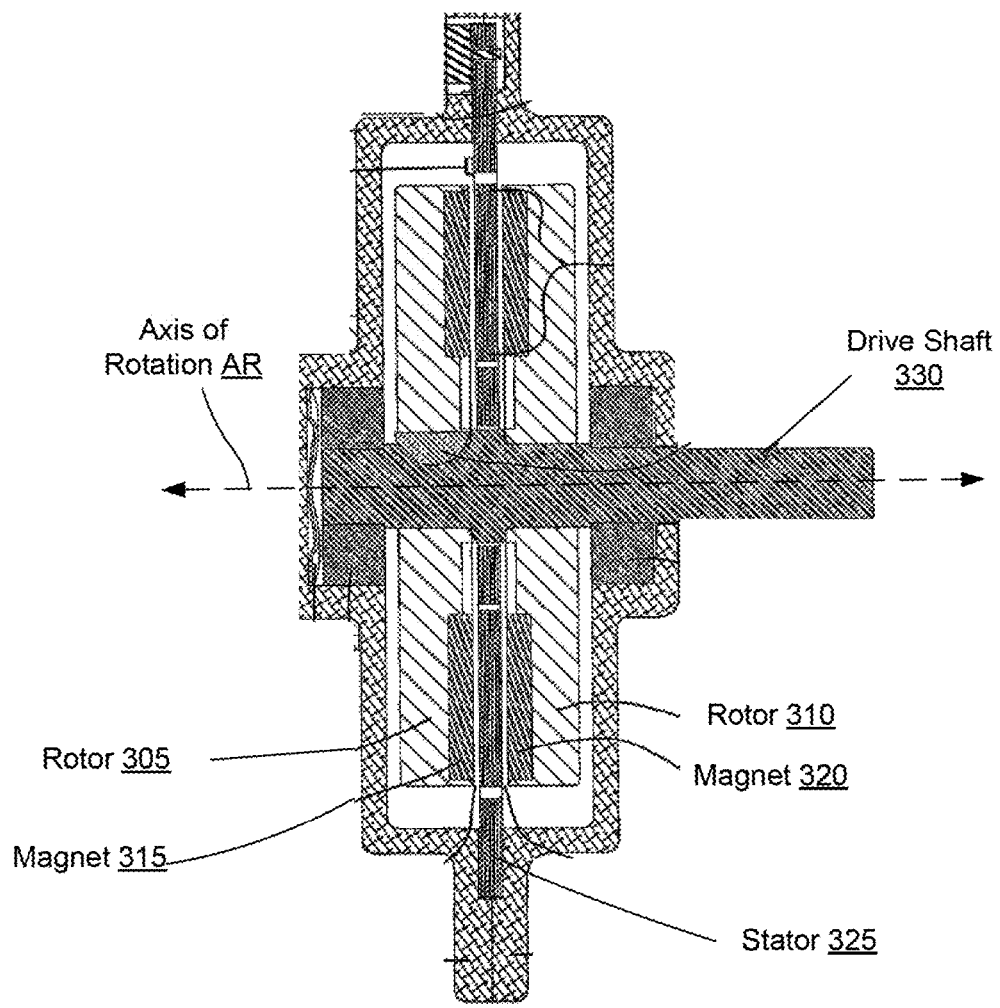
FIG. 3 illustrates a cross-sectional view of a motor with a stator having a laminated composite assembly, according to an embodiment.

In some embodiments, current can be induced in the conductors of the laminated composite assembly. For example, FIG. 3 is a schematic illustration of a cross-sectional view of a generator having a drive shaft 330, rotor segments 305 and 310, a stator 325, and magnets 315 and 320. The generator in FIG. 3 can be, for example, a wind turbine generator.

In some embodiments, drive shaft 330 can be fixedly coupled to rotor segments 305, 310 (formed of a magnetically permeable material such as steel), and magnets 315, 320 can be fixedly coupled to rotor segments 305, 310. The end of drive shaft 330 that is not fixedly coupled to rotor segments 305, 310 can protrude through an opening of the generator housing. In some embodiments, the protruding end of drive shaft 330 can be coupled to an exterior device, such as blades of a wind turbine. When wind causes the blades of the wind turbine to move, drive shaft 330 rotates, causing rotor segments 305, 310 to rotate, in turn causing magnets 315, 320 to rotate.

Magnets 315, 320 can be rings that have poles N and S that alternate around the ring. In some embodiments, magnets 315, 320 can be made of individual segments. Magnets 315, 320 can be magnetic material including rare earth metals such as alloys of neodymium, iron, and/or boron. Magnets 315, 320 can have any even number of poles.

Figure 4:
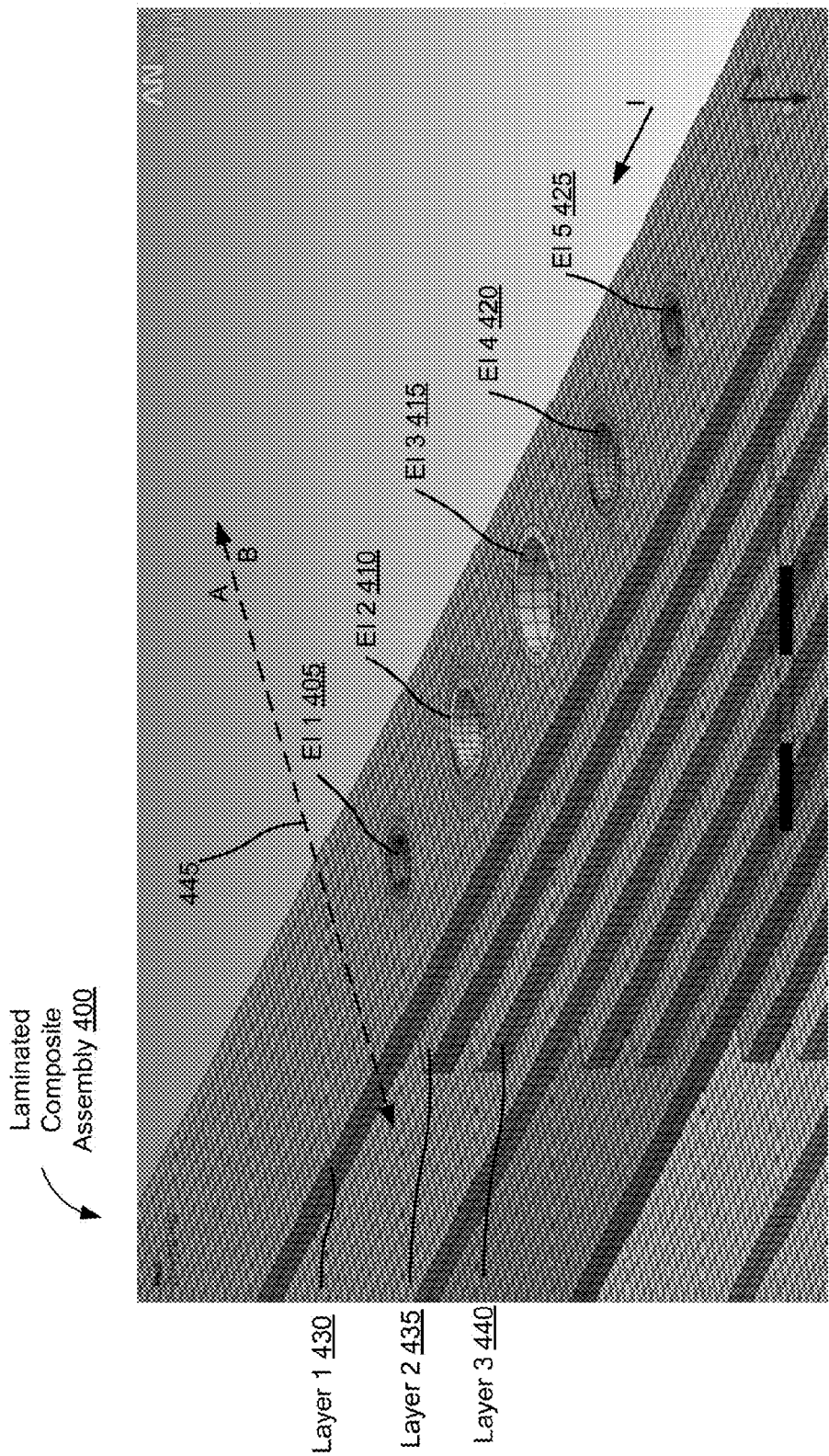
FIG. 4 illustrates a laminated composite assembly with multiple electrical interconnects, according to an embodiment.

Stator 325 can be a laminated composite assembly, including a PCB, with conductive layers that are electrically coupled with electrical interconnects as described in FIG. 1 and as further described in FIG. 4.

FIG. 4 is a three-dimensional depiction of a portion of a laminated composite assembly 400 having multiple conductive layers 430, 435, 440 and multiple electrical interconnects 405, 410, 415, 420, 425. Conductive layers 430, 435, 440 can be electrically coupled by multiple electrical interconnects 405, 410, 415, 420, 425. Line 445 can indicate the separation between the operative portions of the conductors on side "B" of line 445 and end turn portions of the conductors on side "A" of line 445. As shown in FIG. 4, some layers do not have end turn portions. For example, the second and third layers 435, 440 do not have end turn portions, but the first layer 430 has an end turn portion.

Current "I" can flow on the conductive layers 430, 435, 440 of the laminated composite assembly 400 in the direction shown. The fifth electrical interconnect 425 can be disposed in the current "I" path prior to the fourth electrical interconnect 420, which can be disposed in the current "I" path prior to the third electrical interconnect 415, and so forth. Similarly stated, the current "I" can reach the fifth electrical interconnect 425 first and the first electrical interconnect 405 last.

In some embodiments, the current "I" does not flow beyond the first electrical interconnect 405 on the conductor on the second layer 435 and/or on the third layer 440. Instead, substantially all of the current "I" from the second and third layers 435, 440 flows through the electrical interconnects 405, 410, 415, 420, 425 to the first layer 430. The current "I" can flow on the first layer 430 beyond line 445 to the end turn portion of the conductor (i.e., side A of line 445). As shown in FIG. 4, however, the second and third layers 435, 440 do not have an end turn portion.

In some embodiments, FIG. 4 can be a portion of a laminated composite assembly defining a machine winding in a stator (e.g., stator 325). Laminated composite assembly 400 can include operative portions on each layer and end turn portions on a subset of the layers. For example, the first, second, and third layers 430, 435, 440 extend beyond line 445 on side "B," so the first, second, and third layers 430, 435, 440 have operative portions. The second and third layers 435, 440, however, do not extend to side A of line 445, so the second and third layers 435, 440 do not have end turn portions. The first layer 430 does extend to side A of line 445, so the first layer 430 does have an end turn portion. The portion of the laminated composite assembly 400 in FIG. 4 can be related to one phase of a multi-phase stator as part of a machine winding. The end turns of various phases in a machine winding can have conductors that overlap in the thickness direction. Some operative conductor layers do not have an end turn section for that phase. The operative conductor layers that do not have an end turn section for that phase can be electrically coupled to a layer that does have an end turn section for that phase using electrical interconnects. For example, laminated composite assembly 400 can have multiple layers 430, 435, 440 as was described in more detail in FIGS. 1 and 2A-2C. The first layer 430 can be a operative conductor of a stator winding with an end turn section. The second and third layers 435, 440 can be operative conductors of a common phase as the first layer 430. The second and third layers 435, 440 do not have an end turn section. Laminated composite assembly 400 can have multiple electrical interconnects, 405, 410, 415, 420, 425 (as was described in FIGS. 1 and 2A-2C) that couple the second and third layers 435, 440 to the first layer 430.

As shown in FIG. 4, the first electrical interconnect 405 can have a width that is substantially the same as a width of the fifth electrical interconnect 425. The second and fourth electrical interconnects 410 and 420 can have widths that are substantially the same, but larger than the widths of the first and fifth electrical interconnects 405 and 425. The third electrical interconnect 415 can have a width that is greater than the widths of the other electrical interconnects 405, 410, 420, and 425.

Referring back to FIG. 3, in use, magnets 315 and 320 can be positioned so that an N pole on magnet 315 faces an S pole on magnet 320. The alternating magnetic poles of magnets 315, 320 create a circumferentially alternating magnetic flux in the air gap formed between the rotor segments 305, 310, where the stator is located. A force (e.g., wind) can cause rotation of drive shaft 330 around the axis of rotation AR, which causes rotor segments 305, 310 to rotate with drive shaft 330, in turn causing magnets 315, 320 to rotate around drive shaft 330 (i.e., around the axis of rotation AR). The rotation of magnets 315, 320 causes the alternating magnetic flux to move with respect to the stator 325, which can induce an alternating voltage in the windings contained in stator 325 (e.g., the conductors of the laminated composite assembly).

In some embodiments, a current can be applied to stator 325, which can produce Lorentz forces between the flowing current and the magnetic field generated by magnets 315, 320. The resulting torque can cause magnets 315, 320 to rotate. The rotation of magnets 315, 320 can cause rotor segments 305, 310 to rotate, in turn causing drive shaft 330 to rotate. Thus, in some embodiments, the device in FIG. 3 can function as a motor rather than a generator.

Referring now to FIG. 4, in some embodiments, laminated composite assembly 400 can be a portion of stator 325. The current "I" can be the current induced in stator 325 as described above. The electrical interconnects 405, 410, 415, 420, 425 can allow the current "I" to flow from the second and third layers 435, 440 to the first layer 430. As the current "I" flows in the direction shown in FIG. 4, it can arrive first at the fifth electrical interconnect 425, which can allow some of the current "I" on the second and third layers 435, 440 to flow to the first layer 430. The current "I" can continue to flow to the fourth electrical interconnect 420. There some of the current "I" on the second and third layers 435, 440 can flow through the fourth electrical interconnect 420 to the first layer 430. This can continue until the current "I" reaches the first electrical interconnect 405 and the remaining current "I" on the second and third layers 435, 440 can flow through the first electrical interconnect 405 to the first layer 430. Current "I" can flow on the conductor of the first layer 430 beyond the first electrical interconnect 405 in the direction shown to the end turn portion (i.e., side "A" of line 445) of the first layer 430.

The collection of current from other layers of a common phase can cause the current density on the conductor to be greater at the electrical interconnects that are reached later ("downstream") in the current path. For example, in laminated composite assembly 400, current "I" can reach the fifth electrical interconnect 425 prior to reaching the fourth electrical interconnect 420, and so forth until it reaches the first electrical interconnect 405. Similarly stated, the fifth electrical interconnect can be disposed on the conductor in the current "I" path prior to the fourth electrical interconnect 420, which can be disposed on the conductor in the current "I" path prior to the third electrical interconnect, and so forth. On the first layer 430, the current density on the conductor can be higher at the fourth electrical interconnect 420 than at the fifth electrical interconnect 425, and highest at the first electrical interconnect 405.

Varying the widths of the electrical interconnects as shown in FIG. 4 can allow more current to flow through the electrical interconnects with greater widths (e.g. the third electrical interconnect 415) and less to flow through the electrical interconnects with smaller widths (e.g. the fifth electrical interconnect 425). As the current "I" approaches the fifth electrical interconnect 425, which has a width that is less than the fourth electrical interconnect 420, there is less resistance on the conductor than the resistance on the conductor if the fifth electrical interconnect were substantially the same width as the fourth electrical interconnect 420. The reduced resistance on the conductor can allow more current "I" to flow beyond the fifth electrical interconnect on the conductors on the second and third layers 435, 440 to the fourth electrical interconnect 420. Similarly, the width of the fourth electrical interconnect 420 can be less than the width of the third electrical interconnect 415, which can allow more current "I" to flow beyond the fourth electrical interconnect 420 to the third electrical interconnect 415.

If the electrical interconnects 405, 410, 415, 420, 425 were substantially the same width, more current "I" could flow through the fifth electrical interconnect 425 than the fourth electrical interconnect 420, and more current "I" could flow through the fourth electrical interconnect 420 than the third electrical interconnect 415, and so forth. Because more current can flow through the electrical interconnects that are reached first in the current path, the electrical interconnects reached later in the current path (e.g. the first electrical interconnect 405) can be underutilized and have a lower current density than the electrical interconnects reached earlier in the current path.

Varying the widths of the electrical interconnects as shown in FIG. 4 can more evenly distribute the current through the electrical interconnects. For example, less current "I" can flow through the fifth electrical interconnect 425 having a width that is less than if the fifth electrical interconnect 425 had a width substantially the same as the width of the fourth electrical interconnect 420. Similarly, less current "I" can flow through the fourth electrical interconnect 420 having a width that is less than if the fourth electrical interconnect 420 had a width substantially the same as the width of the third electrical interconnect 415. Less current flowing through the electrical interconnects that the current reaches earlier in the current path can result in more uniform current density through the electrical interconnects than if the electrical interconnects that the current reaches later in the current path were underutilized as described above.

The widths can vary from smaller at the first electrical interconnect 405 to larger at the third electrical interconnect 415 and back to smaller at the fifth electrical interconnect 425. Such a configuration can allow the current density through the electrical interconnects and on the conductor to remain more uniform even if alternating current is used in the laminated composite assembly 400. For example, if current "I" is AC, initially the current "I" can flow on the conductors on each layer in the direction shown in FIG. 4. As described above, the current density through the electrical interconnects can be more uniform because the width of the fifth electrical interconnect 425 is less than the width of the fourth and third electrical interconnects 420, 415, and the width of the fourth electrical interconnect 420 is less than the width of the third electrical interconnect 415. Similarly, when the current "I" changes direction (i.e., alternates), the current density through the electrical interconnects can be more uniform because the width of the first electrical interconnect 405 is less than the width of the second and third electrical interconnects 410, 415, and the width of the second electrical interconnect 410 is less than the width of the third electrical interconnect 415. Similarly stated, because the electrical interconnect widths vary from smaller to larger back to smaller, the second, third, and fourth electrical interconnects 410, 415, 420 can be properly utilized, and not underutilized as described above, regardless of the direction the current "I" is flowing.

Figure 5A:
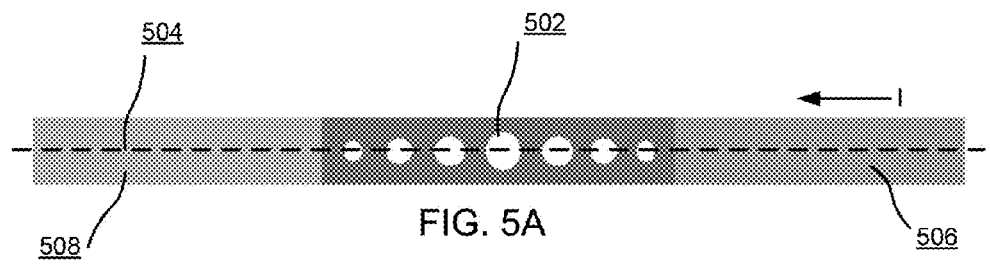
FIGS. 5A-8 illustrate laminated composite assemblies with multiple electrical interconnects, according to other embodiments.

While the electrical interconnects shown in FIGS. 1 and 4 vary in width and number, the center of each electrical interconnect is substantially located along a centerline axis of a conductor, and the electrical interconnects form a single, linear array. FIG. 5A is a portion of a top view of a layer of a laminated composite assembly having a centerline axis 504, conductor portions 506, 508, and electrical interconnects 502. Similar to the electrical interconnects in FIGS. 1 and 4, electrical interconnects 502 form a single, linear array substantially aligned on the centerline axis 504. In some embodiments, portions 506 and 508 represent conductors on multiple layers electrically coupled by electrical interconnects 502. In some embodiments, the conductor 506 is on a first layer and is electrically coupled through electrical interconnects 502 to a conductor 508 on a second layer. In some embodiments, there is a current "I," which flows in the direction shown in FIG. 5A. In some embodiments the electrical current "I" can flow on the first layer 506, through electrical interconnects 502, and continue on the second layer 508 once it passes through electrical interconnects 502. Similarly stated, current "I" on the first layer 506 does not continue to flow beyond electrical interconnects 502, and current "I" does not begin to flow on the second layer 508 prior to electrical interconnects 502.

Though FIG. 1, FIG. 4, and FIG. 5A have configurations where the center of the electrical interconnects are substantially aligned along a centerline axis, in other embodiments the electrical interconnects are not aligned along a centerline axis. For example, FIG. 5B, another illustrative embodiment, depicts a portion of a top view of a layer of a laminated composite assembly having electrical interconnects 510 with edges substantially aligned along an axis 512 at an edge portion of the conductor. Similarly, in other embodiments, the electrical interconnects 510 can be substantially aligned along an opposite edge portion of the conductor and/or the opposite edges of the electrical interconnects 510.

In other embodiments, the electrical interconnects can form a single, linear array that is aligned diagonally. For example, FIG. 5C depicts a portion of a top view of a layer of a laminated composite assembly having electrical interconnects 520 substantially aligned diagonally along a centerline axis 522. Similarly stated, electrical interconnects 520 can be substantially aligned along an axis that forms a non-zero angle with respect to centerline axis 522.

Figure 5B:
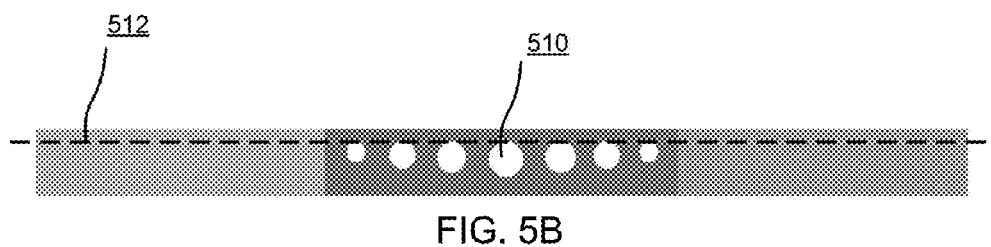
Figure 5C:
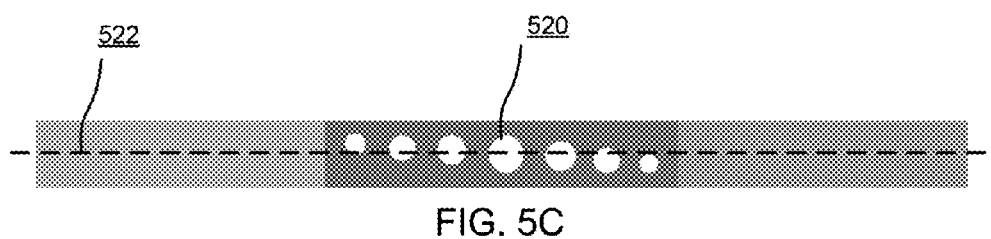

Though each of the embodiments shown in FIG. 5A-FIG. 5C show seven electrical interconnects, any number of electrical interconnects can be used. Similarly, any shape of electrical interconnect can be used.

Figure 5D:
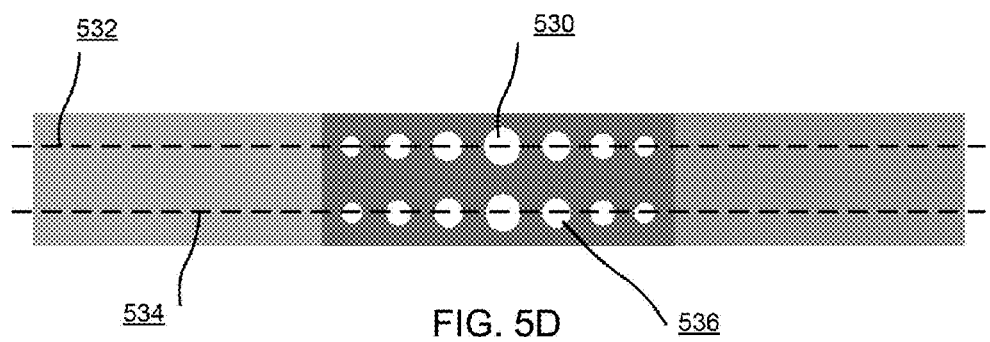

Furthermore, more than one linear array can be used. For example, FIG. 5D is another illustrative embodiment, depicting a top view of a portion of a layer of a laminated composite assembly having two linear arrays of electrical interconnects 530, 536 and two axes 532, 534. The center of electrical interconnects 530 can be substantially aligned along an axis 532, and the center of electrical interconnects 536 can be substantially aligned along a second axis 534. The first axis 532 and the second axis 534 can be parallel to a centerline axis (such as that depicted in FIG. 5A).

Figure 5E:
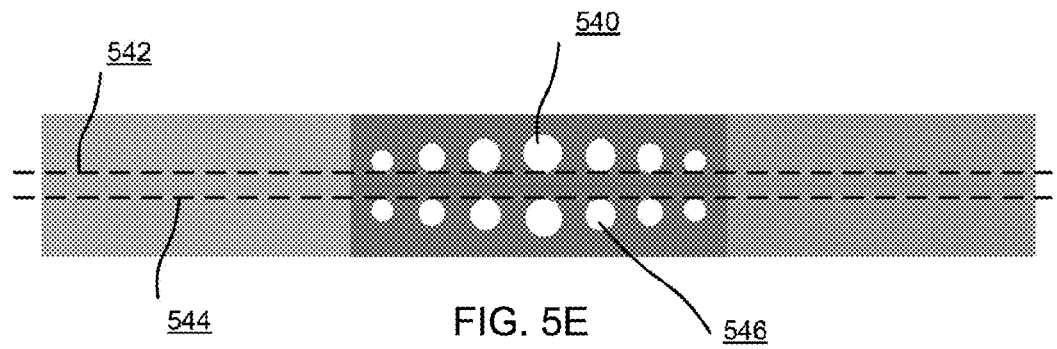

In another embodiment, the inside edges of multiple linear arrays of electrical interconnects can be aligned along one or more axes. For example, FIG. 5E depicts a portion of a top view of a layer of a laminated composite assembly having two linear arrays of electrical interconnects 540, 546 and two axes 542, 544. The inside edges of the first linear array of electrical interconnects 540 can be substantially aligned along an axis 542, and the inside edges of the second linear array of electrical interconnects 546 can be substantially aligned along a second axis 544.

Figure 5F:
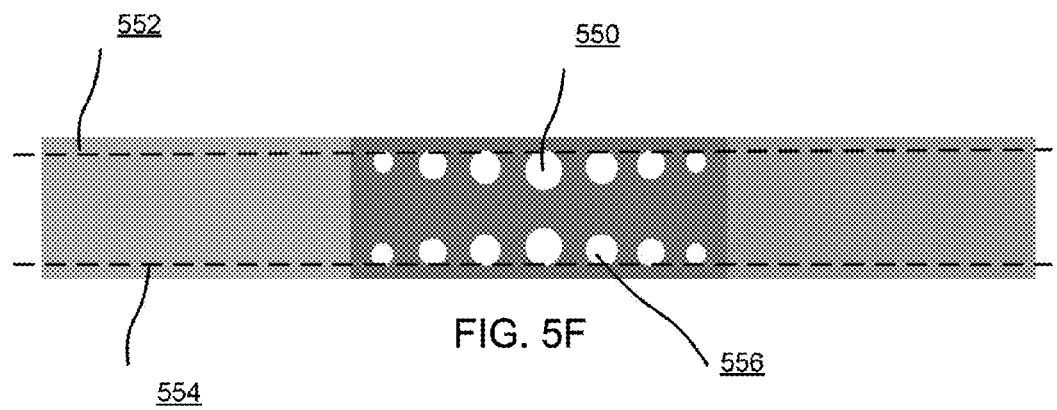

In another embodiment, the outside edges of multiple linear arrays of electrical interconnects can be aligned along multiple axes. For example, FIG. 5F depicts a portion of a top view of a layer of a laminated composite assembly having two linear arrays of electrical interconnects 550, 556 and two axes 552, 554. The outside edges of the first linear array of electrical interconnects 550 can be substantially aligned along an axis 552, and the outside edges of the second linear array of electrical interconnects 556 can be substantially aligned along a second axis 554.

Figure 5G:
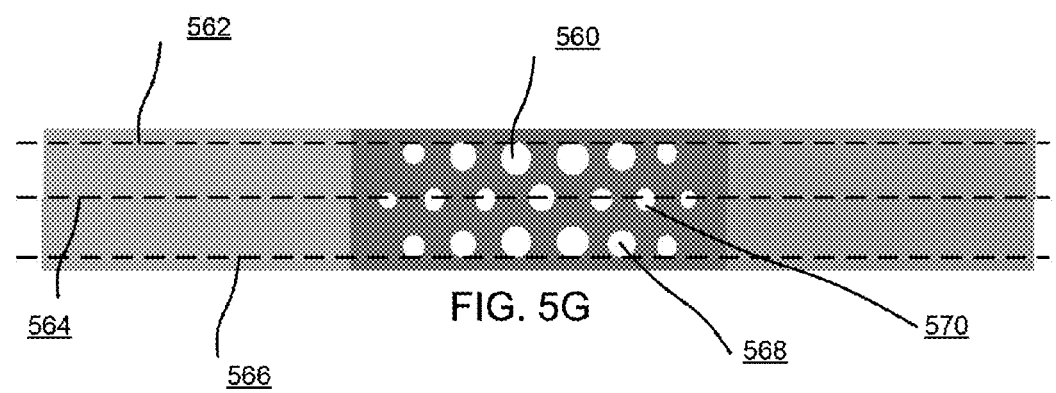

Similarly, any combination of alignments can be used with any number of arrays of electrical interconnects. For example, FIG. 5G is yet another illustrative embodiment of a portion of a top view of a layer of a laminated composite assembly having three linear arrays of electrical interconnects 560, 568, 570 aligned along three different axes 562, 564, 566. As shown in FIG. 5G, each linear array can have a different number of electrical interconnects. Moreover, each linear array can have electrical interconnects of different widths of the other linear arrays. FIG. 5G also shows that each linear array can have a different alignment than the other linear arrays. For example, the outside edges of linear arrays 560 and 568 are substantially aligned along axes 562 and 566, and the centers of the electrical interconnects 570 are aligned along axis 564. While the previous figures all have one or more linear arrays of electrical interconnects, in some embodiments, the electrical interconnects are not aligned along an axis.

Figure 6A:
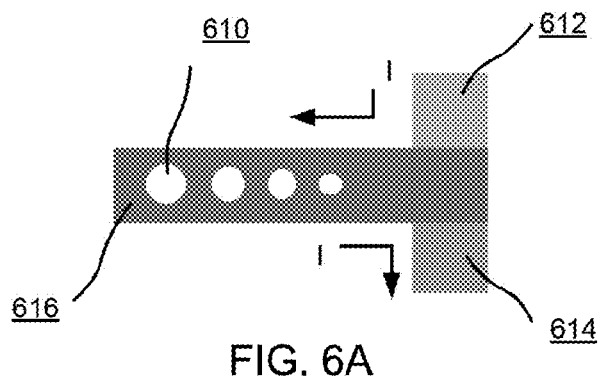

In some embodiments, the electrical interconnects are lapped, as shown in FIG. 6A. FIG. 6A is a schematic illustration of a portion of a top view of two layers of a laminated composite assembly having a linear array of electrical interconnects 610, a first layer 612, a second layer 614, an electrical interconnect section 616, and a current "I".

In some embodiments, current "I" can flow on the conductor in the direction shown in FIG. 6A. The first layer 612 can extend through the electrical interconnect section 616. The second layer 614 can extend through the electrical interconnect section 616. The first layer 612 can overlap the second layer 614 in the electrical interconnect section 616. The first layer 612 can be electrically coupled to the second layer 614 in the electrical interconnect section 616 by electrical interconnects 610.

The current "I" can flow, as shown, from the first layer 612 into the electrical interconnect section 616. In the electrical interconnect section 616, the current "I" can flow from the first layer 612 to the second layer 614 through electrical interconnects 610. Similarly stated, current "I" can flow on the first layer 612 prior to electrical interconnects 610, and current "I" can flow on the second layer 614 beyond electrical interconnects 610. Alternatively, current "I" can flow in the opposite direction. In either embodiment, current can flow between the layers 612, 614 through the electrical interconnects 610, as described in FIG. 1.

In some embodiments, the current "I" can continue to flow on the first layer 612 and on the second layer 614 both prior to and beyond electrical interconnects 610. In other embodiments, the first layer 612 and the second layer 614 are the same layer.

Figure 6B:
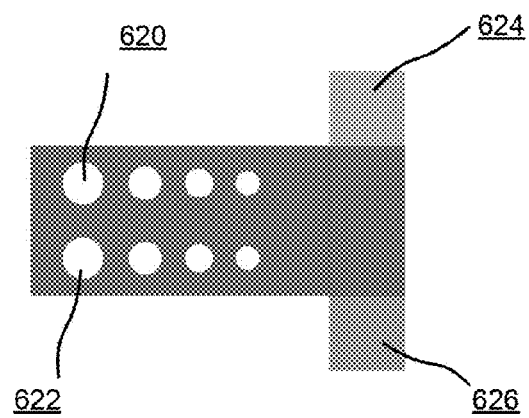

FIG. 6B is another embodiment similar to FIG. 6A, but with two linear arrays of electrical interconnects 620, 622. The first layer 624 can be electrically coupled to the second layer 626 by electrical interconnects 620, 622. A current can flow on the conductors as described in FIG. 6A.

Figure 6C:
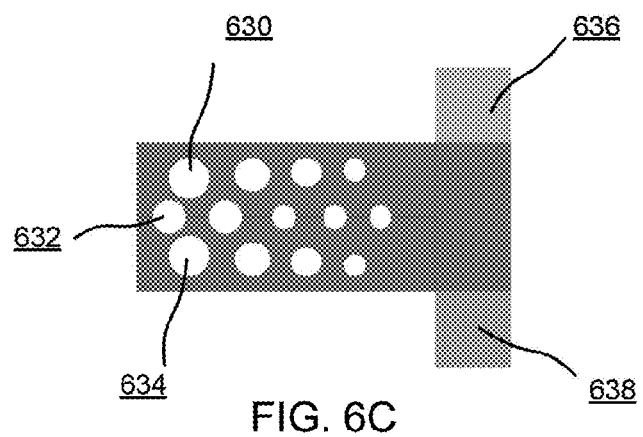

FIG. 6C is another embodiment similar to FIGS. 6A and 6B, but with three linear arrays of electrical interconnects 630, 632, 634. The first layer 636 can be electrically coupled to the second layer 638 by electrical interconnects 630, 632, 634. A current can flow on the conductors as described in FIG. 6A.

While FIGS. 6A, 6B, and 6C have electrical interconnects that are arranged in some combination of linear arrays, in other embodiments electrical interconnects are not arranged in a linear array. Moreover, while shown in FIGS. 6A-6C as having a circular shape, in other embodiments, electrical interconnects can be any shape. The electrical interconnects can vary in width and location on the conductor.

Figure 7A:
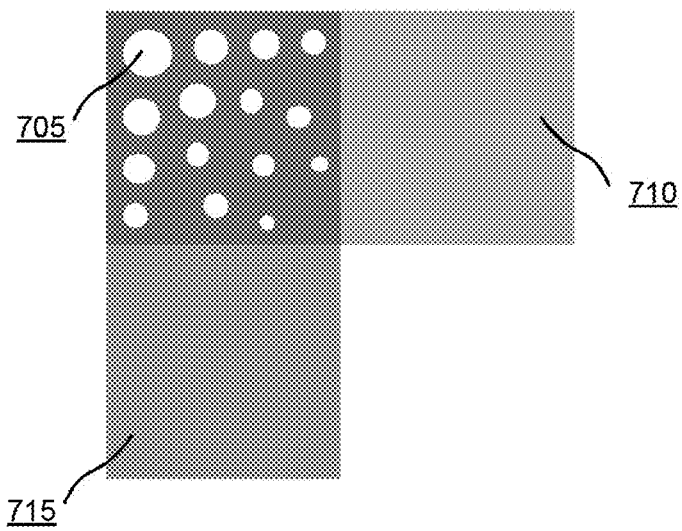

In another embodiment, the electrical interconnects can couple layers on a corner connection of a laminated composite assembly. For example, FIG. 7A is a schematic illustration of a portion of a top view of a laminated composite assembly having two layers 710, 715 and electrical interconnects 705. The first layer 710 can intersect the second layer 715 at a corner portion, and the layers 710, 715 can be electrically coupled by electrical interconnects 705. Similarly stated, the second layer 715 can form a substantially 90-degree angle with the first layer 710.

Figure 7B:
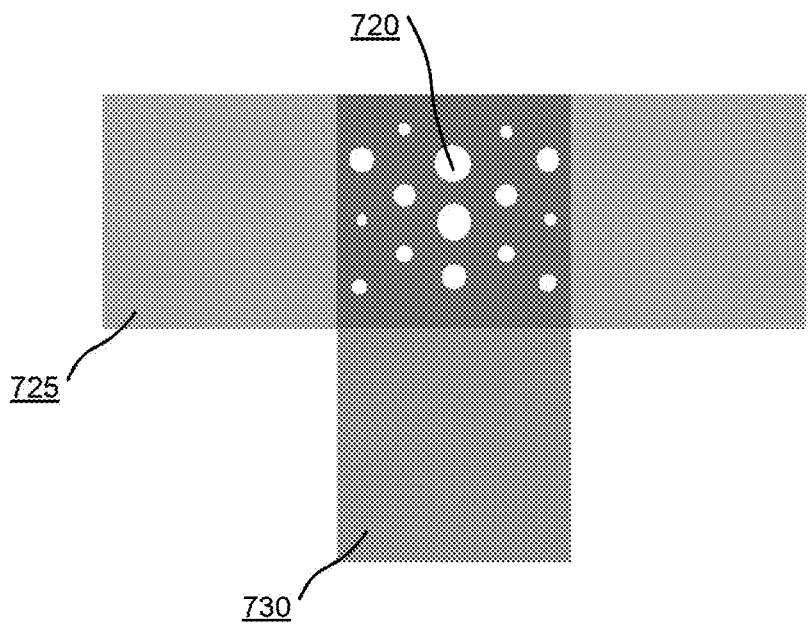

In another embodiment, the electrical interconnects can couple layers that intersect perpendicularly. For example, FIG. 7B is a schematic illustration of a portion of a top view of a laminated composite assembly having two layers 725, 730 and electrical interconnects 720. The first layer 725 can intersect the second layer 730 perpendicularly, forming a 'T.' The first layer 725 can be electrically coupled with the second layer 730 by electrical interconnects 720.

Figure 8:
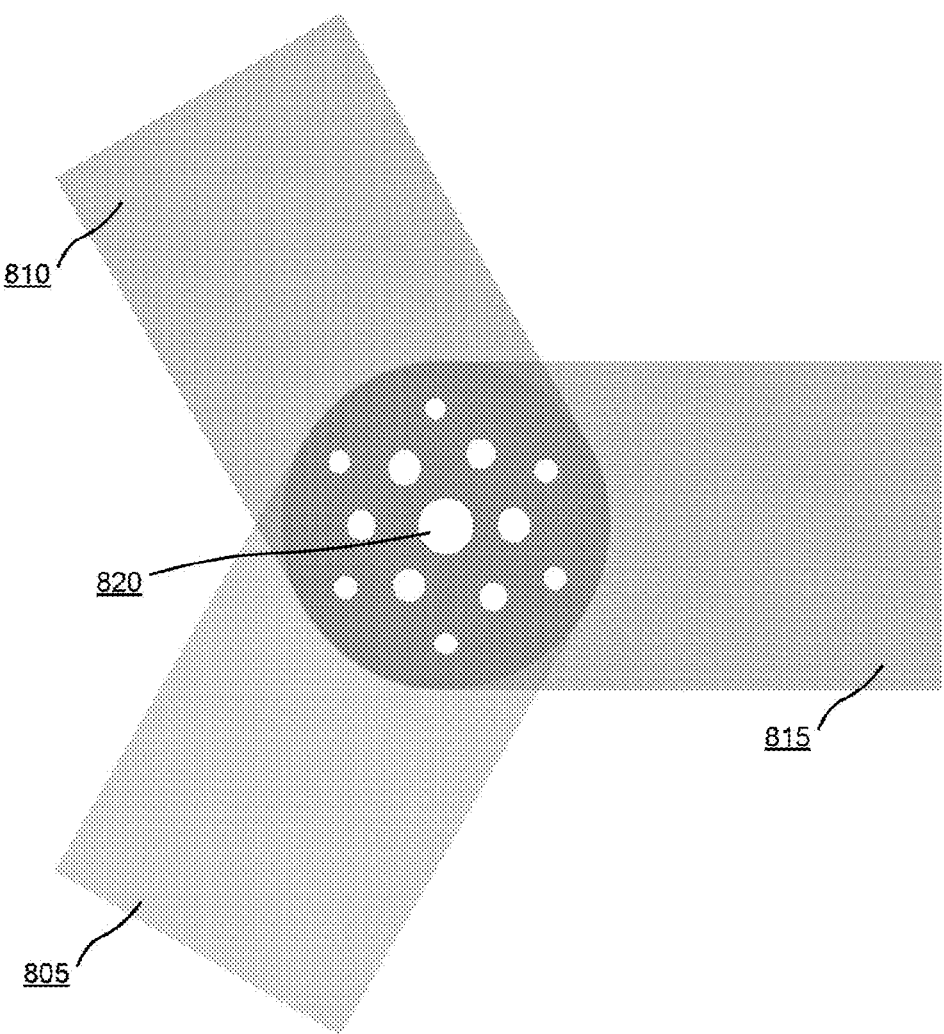

In another embodiment, the electrical interconnects can couple multiple layers that intersect from multiple directions. For example, FIG. 8 is a schematic illustration of a portion of a top view of a laminated composite assembly having three layers 805, 810, 815 and electrical interconnects 820. The first layer 805, the second layer 810, and the third layer 815 can all meet from different directions, forming a 'wye' connection. The multiple layers 805, 810, 815 can be electrically coupled by electrical interconnects 820.

Figure 9A:
FIGS. 9A-9B illustrate laminated composite assemblies with electrical interconnects, according to other embodiments.

FIG. 9A is a schematic illustration of a portion of a top view of a laminated composite assembly similar to FIG. 5A. Electrical interconnect 905 can be diamond shaped and can electrically couple two or more layers. As shown in FIG. 9A, a single electrical interconnect can be used in some embodiments.

Figure 9B:
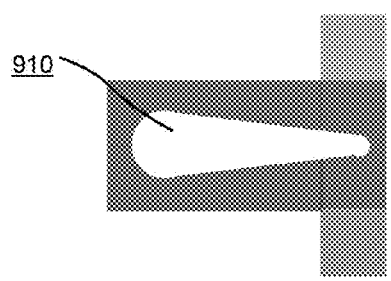

FIG. 9B is another embodiment having a single electrical interconnect. FIG. 9B is a schematic illustration of a portion of a top view of a laminated composite assembly similar to FIG. 6A. Electrical interconnect 910 can be teardrop shaped and can electrically couple two or more layers.

Figure 10A:
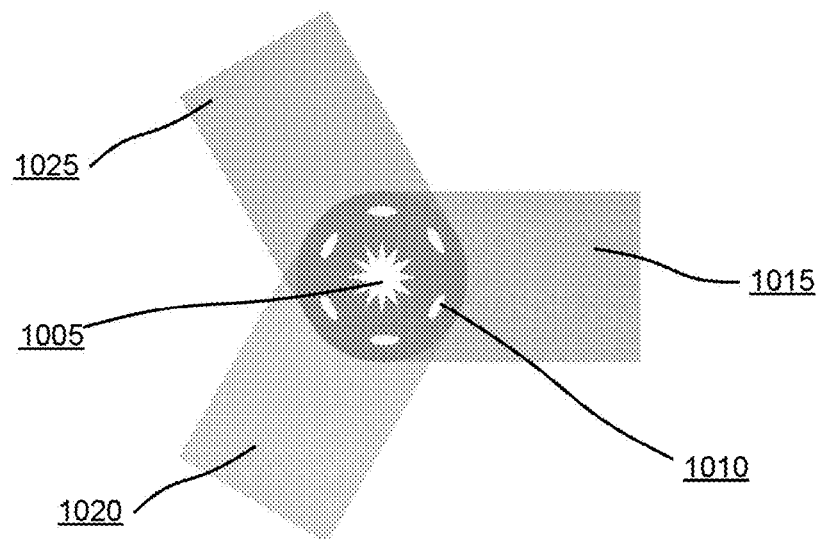
FIGS. 10A-10B illustrate laminated composite assemblies with multiple electrical interconnects, according to other embodiments.

FIG. 10A is a schematic illustration of a portion of a top view of a laminated composite assembly similar to FIG. 8. Electrical interconnect 1005 can be star-shaped, and multiple electrical interconnects 1010 can be oval-shaped. The multiple electrical interconnects 1010 can be disposed on the conductor in a pattern that substantially surrounds electrical interconnect 1005. In other embodiments, electrical interconnects 1010 do not form a pattern but are randomly distributed. Electrical interconnect 1005 can have a width that is greater than the width of electrical interconnects 1010. The electrical interconnects 1005, 1010 can electrically couple two or more layers 1015, 1020, 1025. In some embodiments, electrical interconnects 1010 can have a width and/or shape that is different from the other electrical interconnects 1010.

Figure 10B:
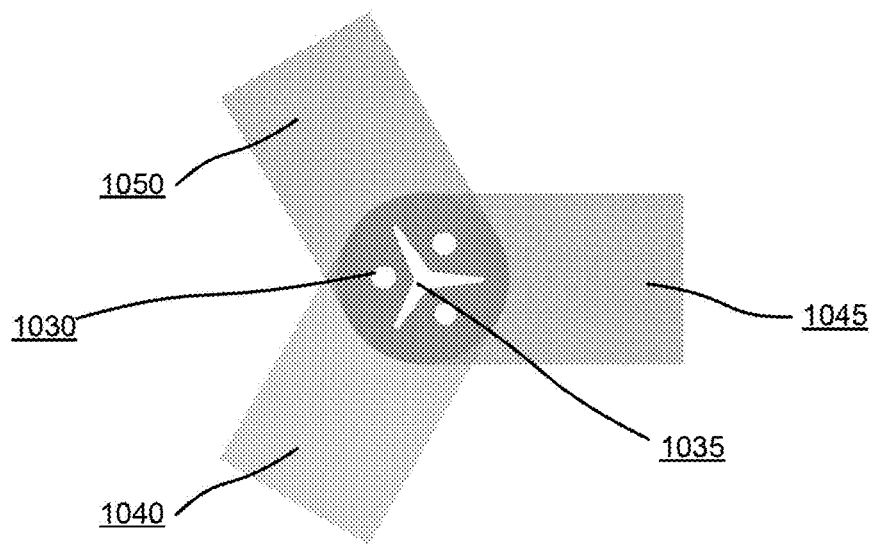

FIG. 10B is a schematic illustration of a portion of a top view of a laminated composite assembly similar to FIGS. 8 and 10A. Electrical interconnect 1035 can include three spokes, although more or fewer can be used. Electrical interconnects 1030 can be circular and can be disposed between the spokes of electrical interconnect 1035. The electrical interconnects 1030, 1035 can electrically couple conductors on different layers 1040, 1045, 1050. In some embodiments, electrical interconnects 1030 can have a width and/or shape that is different from the other electrical interconnects 1030.

While various embodiments have been described above, it should be understood that they have been presented by way of example only, and not limitation. Where methods and/or schematics described above indicate certain events and/or flow patterns occurring in certain order, the ordering of certain events and/or flow patterns may be modified. While the embodiments have been particularly shown and described, it will be understood that various changes in form and details may be made.

Although various embodiments have been described as having particular features and/or combinations of components, other embodiments are possible having a combination of any features and/or components from any of embodiments as discussed above.

What is claimed is:

1. An apparatus, comprising:
a plurality of conductors of a laminated composite assembly; and
a plurality of electrical interconnects including a first electrical interconnect and a second electrical interconnect, each electrical interconnect from the plurality of electrical interconnects electrically coupling each conductor from the plurality of conductors to the remaining conductors from the plurality of conductors, the plurality of conductors including every conductor electrically coupled to the plurality of electrical interconnects, each electrical interconnect from the plurality of electrical interconnects having a width different from a width of at least one remaining electrical interconnect from the plurality of electrical interconnects, each conductor from the plurality of conductors defining a first region between a first side portion of the first electrical interconnect and a first side portion of the second electric interconnect, each conductor from the plurality of conductors defining a second region either (1) extending from a second side portion of the first electrical interconnect opposite the first side portion of the first electrical interconnect or (2) extending from a second side portion of the second electrical interconnect opposite the first side portion of the second electrical interconnect, both the first region and the second region of each conductor from the plurality of conductors configured to be part of a current path,
a first conductor from the plurality of conductors is associated with a winding of a coil, a second conductor from the plurality of conductors is associated with the winding.

2. The apparatus of claim 1, wherein each electrical interconnect from the plurality of electrical interconnects has a shape different from a shape of at least one remaining electrical interconnect from the plurality of electrical interconnects.

3. The apparatus of claim 1, wherein the width of the first electrical interconnect from the plurality of electrical interconnects is greater than the width of the second electrical interconnect from the plurality of electrical interconnects, the second electrical interconnect configured to be in a path of the current flow before the first electrical interconnect.

4. The apparatus of claim 1, wherein each electrical interconnect from the plurality of electrical interconnects is a plated electrical interconnect defining a lumen.

5. The apparatus of claim 1, wherein a first conductor from the plurality of conductors is disposed on a first layer and a second conductor from the plurality of conductors is disposed on a second layer, the first layer and the second layer are separated by an insulating layer, and at least one electrical interconnect from the plurality of electrical interconnects mechanically couples the first layer to the second layer through the insulating layer.

6. The apparatus of claim 1, wherein each electrical interconnect from the plurality of electrical interconnects is at least one of a plated electrical interconnect defining a lumen having a non-conductive material disposed therein, a plated electrical interconnect defining a lumen having a conductive material disposed therein, a solid electrical interconnect, or a pressed pin.

7. The apparatus of claim 1, wherein a resistance value associated with the first electrical interconnect is different than a resistance value associated with the second electrical interconnect.

8. The apparatus of claim 1, wherein the width of the second electrical interconnect is different than the width of the first electrical interconnect to achieve at least one of a predetermined current density of the laminated composite assembly, a predetermined thermal profile of the laminated composite assembly, or a predetermined mechanical coupling profile of the laminated composite assembly when a current flow is induced in the first conductor.

9. An apparatus, comprising:
a plurality of conductors of a laminated composite assembly; and
a plurality of electrical interconnects including a first electrical interconnect and a second electrical interconnect, each electrical interconnect from the plurality of electrical interconnects electrically coupling each conductor from the plurality of conductors to the remaining conductors from the plurality of conductors, the plurality of conductors including every conductor electrically coupled to the plurality of electrical interconnects, each electrical interconnect from the plurality of electrical interconnects having a width different from a width of at least one remaining electrical interconnect from the plurality of electrical interconnects, each conductor from the plurality of conductors defining a first region between a first side portion of the first electrical interconnect and a first side portion of the second electric interconnect, each conductor from the plurality of conductors defining a second region either (1) extending from a second side portion of the first electrical interconnect opposite the first side portion of the first electrical interconnect or (2) extending from a second side portion of the second electrical interconnect opposite the first side portion of the second electrical interconnect, both the first region and the second region of each conductor from the plurality of conductors configured to be part of a current path,
a first conductor from the plurality of conductors includes an end turn of a coil associated with a second conductor from the plurality of conductors.

10. The apparatus of claim 9, wherein the width of the first electrical interconnect from the plurality of electrical interconnects is greater than the width of the second electrical interconnect from the plurality of electrical interconnects, the second electrical interconnect configured to be in a path of the current flow before the first electrical interconnect.

11. The apparatus of claim 9, wherein each electrical interconnect from the plurality of electrical interconnects is a plated electrical interconnect defining a lumen.

12. The apparatus of claim 9, wherein a first conductor from the plurality of conductors is disposed on a first layer and a second conductor from the plurality of conductors is disposed on a second layer, the first layer and the second layer are separated by an insulating layer, and at least one electrical interconnect from the plurality of electrical interconnects mechanically couples the first layer to the second layer through the insulating layer.

13. The apparatus of claim 9, wherein each electrical interconnect from the plurality of electrical interconnects has a shape different from a shape of at least one remaining electrical interconnect from the plurality of electrical interconnects.

14. The apparatus of claim 9, wherein each electrical interconnect from the plurality of electrical interconnects is at least one of a plated electrical interconnect defining a lumen having a non-conductive material disposed therein, a plated electrical interconnect defining a lumen having a conductive material disposed therein, a solid electrical interconnect, or a pressed pin.

15. The apparatus of claim 9, wherein a resistance value associated with the first electrical interconnect is different than a resistance value associated with the second electrical interconnect.

16. The apparatus of claim 9, wherein the width of the second electrical interconnect is different than the width of the first electrical interconnect to achieve at least one of a predetermined current density of the laminated composite assembly, a predetermined thermal profile of the laminated composite assembly, or a predetermined mechanical coupling profile of the laminated composite assembly when a current flow is induced in the first conductor.

17. An apparatus, comprising:
a plurality of conductors of a laminated composite assembly; and
a plurality of electrical interconnects including a first electrical interconnect and a second electrical interconnect, each electrical interconnect from the plurality of electrical interconnects electrically coupling each conductor from the plurality of conductors to the remaining conductors from the plurality of conductors, the plurality of conductors including every conductor electrically coupled to the plurality of electrical interconnects, each electrical interconnect from the plurality of electrical interconnects having a width different from a width of at least one remaining electrical interconnect from the plurality of electrical interconnects, each conductor from the plurality of conductors defining a first region between a first side portion of the first electrical interconnect and a first side portion of the second electric interconnect, each conductor from the plurality of conductors defining a second region either (1) extending from a second side portion of the first electrical interconnect opposite the first side portion of the first electrical interconnect or (2) extending from a second side portion of the second electrical interconnect opposite the first side portion of the second electrical interconnect, both the first region and the second region of each conductor from the plurality of conductors configured to be part of a current path,
the first electrical interconnect from the plurality of electrical interconnects electrically couples at least two of a power distribution conductor of the laminated composite assembly, an internal bus bar conductor of the laminated composite assembly, or an end turn of a coil on the laminated composite assembly.

18. The apparatus of claim 17, wherein the width of the first electrical interconnect from the plurality of electrical interconnects is greater than the width of the second electrical interconnect from the plurality of electrical interconnects, the second electrical interconnect configured to be in a path of the current flow before the first electrical interconnect.

19. The apparatus of claim 17, wherein each electrical interconnect from the plurality of electrical interconnects is a plated electrical interconnect defining a lumen.

20. The apparatus of claim 17, wherein a first conductor from the plurality of conductors is disposed on a first layer and a second conductor from the plurality of conductors is disposed on a second layer, the first layer and the second layer are separated by an insulating layer, and at least one electrical interconnect from the plurality of electrical interconnects mechanically couples the first layer to the second layer through the insulating layer.

21. The apparatus of claim 17, wherein each electrical interconnect from the plurality of electrical interconnects has a shape different from a shape of at least one remaining electrical interconnect from the plurality of electrical interconnects.

22. The apparatus of claim 17, wherein each electrical interconnect from the plurality of electrical interconnects is at least one of a plated electrical interconnect defining a lumen having a non-conductive material disposed therein, a plated electrical interconnect defining a lumen having a conductive material disposed therein, a solid electrical interconnect, or a pressed pin.

23. The apparatus of claim 17, wherein a resistance value associated with the first electrical interconnect is different than a resistance value associated with the second electrical interconnect.

24. The apparatus of claim 17, wherein the width of the second electrical interconnect is different than the width of the first electrical interconnect to achieve at least one of a predetermined current density of the laminated composite assembly, a predetermined thermal profile of the laminated composite assembly, or a predetermined mechanical coupling profile of the laminated composite assembly when a current flow is induced in the first conductor.

* * * * *